(12) United States Patent
Darilek (10) Patent No.: US 7,723,958 B2
(45) Date of Patent: May 25, 2010

(54) BATTERY CHARGE INDICATION METHODS, BATTERY CHARGE MONITORING DEVICES, RECHARGEABLE BATTERIES, AND ARTICLES OF MANUFACTURE

(75) Inventor: Christopher Darilek, Austin, TX (US)

(73) Assignee: Valence Technology, Inc., Las Vegas, NV (US)

( * ) Notice: Subject to any disclaimer, the term of this patent is extended or adjusted under 35 U.S.C. 154(b) by 340 days.

(21) Appl. No.: 11/394,726

(22) Filed: Mar. 31, 2006

(65) Prior Publication Data

US 2007/0236183 A1 Oct. 11, 2007

(51) Int. Cl.
H02J 7/00 (2006.01)
G01R 31/36 (2006.01)
G01N 27/416 (2006.01)

(52) U.S. Cl. .......................... 320/132; 320/130; 702/63; 324/427

(58) Field of Classification Search ................. 320/118, 320/119, 120, 121, 122, 123, 125, 127, 132, 320/134, 136, DIG. 21, DIG. 19; 324/427, 324/432, 434; 702/63, 88, 99
See application file for complete search history.

(56) References Cited

U.S. PATENT DOCUMENTS

| | | | |
|---|---|---|---|
| 4,477,541 A | 10/1984 | Fraioli | |
| 4,668,595 A | 5/1987 | Yoshino et al. | |
| 4,792,504 A | 12/1988 | Schwab et al. | |
| 4,830,939 A | 5/1989 | Lee et al. | |
| 4,935,317 A | 6/1990 | Fauteux et al. | |
| 4,990,413 A | 2/1991 | Lee et al. | |
| 5,037,712 A | 8/1991 | Shackle et al. | |
| 5,262,253 A | 11/1993 | Golovin | |
| 5,272,382 A * | 12/1993 | Heald et al. | 307/66 |
| 5,300,373 A | 4/1994 | Shackle | |
| 5,399,447 A | 3/1995 | Chaloner-Gill et al. | |
| 5,411,820 A | 5/1995 | Chaloner-Gill et al. | |
| 5,418,091 A | 5/1995 | Gozdz et al. | |
| 5,435,054 A | 7/1995 | Tonder et al. | |
| 5,463,179 A | 10/1995 | Chaloner-Gill et al. | |
| 5,482,795 A | 1/1996 | Chaloner-Gill | |
| 5,508,130 A | 4/1996 | Golovin | |
| 5,514,946 A * | 5/1996 | Lin et al. | 702/63 |
| 5,541,020 A | 7/1996 | Golovin et al. | |
| 5,616,436 A | 4/1997 | Sonobe et al. | |
| 5,620,810 A | 4/1997 | Golovin et al. | |
| 5,629,600 A * | 5/1997 | Hara | 320/132 |
| 5,640,081 A * | 6/1997 | Austin et al. | 320/127 |
| 5,643,695 A | 7/1997 | Barker et al. | |
| 5,660,948 A | 8/1997 | Barker | |
| 5,700,298 A | 12/1997 | Shi et al. | |
| 5,712,059 A | 1/1998 | Barker et al. | |
| 5,830,602 A | 11/1998 | Barker et al. | |
| 5,851,504 A | 12/1998 | Barker et al. | |
| 5,869,208 A | 2/1999 | Miyasaka | |
| 5,882,821 A | 3/1999 | Miyasaka | |
| 5,895,440 A * | 4/1999 | Proctor et al. | 702/63 |
| 6,020,087 A | 2/2000 | Gao | |
| 6,075,340 A * | 6/2000 | Koenck | 320/112 |
| 6,103,419 A | 8/2000 | Saidi et al. | |
| 6,121,754 A * | 9/2000 | Kamperschroer | 320/132 |
| 6,136,472 A | 10/2000 | Barker et al. | |
| 6,157,169 A * | 12/2000 | Lee | 320/132 |
| 6,208,115 B1 | 3/2001 | Binder | |
| 6,306,215 B1 | 10/2001 | Larkin | |
| 6,326,767 B1 * | 12/2001 | Small et al. | 320/116 |
| 6,387,568 B1 | 5/2002 | Barker et al. | |
| 6,404,163 B1 * | 6/2002 | Kapsokavathis et al. | 320/104 |
| 6,528,033 B1 | 3/2003 | Barker et al. | |
| 6,967,466 B2 * | 11/2005 | Koch | 320/132 |
| 6,972,542 B2 * | 12/2005 | Patino et al. | 320/106 |
| 7,107,161 B2 | 9/2006 | Ahmed et al. | |
| 2002/0070709 A1 * | 6/2002 | Small et al. | 320/150 |
| 2002/0192553 A1 | 12/2002 | Barker et al. | |
| 2003/0027049 A1 | 2/2003 | Barker et al. | |
| 2003/0129492 A1 | 7/2003 | Barker et al. | |
| 2003/0170542 A1 | 9/2003 | Barker et al. | |
| 2004/0046673 A1 | 3/2004 | Kovarik et al. | |

(Continued)

FOREIGN PATENT DOCUMENTS

WO WO 98/12761 3/1998

(Continued)

OTHER PUBLICATIONS

PCT/US07/64997; International Search Report; Feb. 22, 2008; 2 pages.

(Continued)

*Primary Examiner*—Patrick J Assouad
*Assistant Examiner*—M'Baye Diao
(74) *Attorney, Agent, or Firm*—Wells St. John, P.S.

(57) ABSTRACT

Battery charge indication methods, battery state of charge monitoring devices, rechargeable batteries, and articles of manufacture are described. According to one aspect, a battery charge indication method includes first determining a state of charge of a battery at a first moment in time using a first method, second determining a state of charge of the battery at a second moment in time using a second method different than the first method, and providing information regarding the state of charge of the battery at the first and second moments in time using information of the first and second determinings.

37 Claims, 1 Drawing Sheet

U.S. PATENT DOCUMENTS

| | | | |
|---|---|---|---|
| 2004/0189255 A1* | 9/2004 | Koch | 320/132 |
| 2005/0046387 A1* | 3/2005 | Aker et al. | 320/125 |
| 2005/0062456 A1* | 3/2005 | Stone et al. | 320/116 |
| 2005/0077878 A1 | 4/2005 | Carrier et al. | |
| 2006/0071643 A1* | 4/2006 | Carrier et al. | 320/132 |

FOREIGN PATENT DOCUMENTS

| | | |
|---|---|---|
| WO | WO 00/01024 | 1/2000 |
| WO | WO 00/31812 | 6/2000 |
| WO | WO 00/57505 | 9/2000 |
| WO | WO 01/54212 | 7/2001 |
| WO | WO 02/44084 | 6/2002 |
| WO | WO 03/085757 | 3/2003 |
| WO | WO 03/085771 | 10/2003 |
| WO | WO 03/088383 | 10/2003 |

OTHER PUBLICATIONS

PCT/US07/64997; Written Opinion; Feb. 22, 2008; 6 pages.

* cited by examiner

BATTERY CHARGE INDICATION METHODS, BATTERY CHARGE MONITORING DEVICES, RECHARGEABLE BATTERIES, AND ARTICLES OF MANUFACTURE

TECHNICAL FIELD

This invention relates to battery charge indication methods, battery charge monitoring devices, rechargeable batteries, and articles of manufacture.

BACKGROUND OF THE INVENTION

The sophistication and uses of electrical devices have increased dramatically. Consumer items having electrical components are ubiquitous in communications, computing, entertainment, transportation, etc. Numerous people rely upon or have grown accustomed to usage of electrical devices for business, education, or for other needs. Electronic devices are increasingly portable to accommodate these needs during travels from home or the workplace. The sophistication and capabilities of power supplies for such devices have also improved to meet the requirements of the electronic consumer devices. For example, cost, size, and capacity are some product characteristics which have been improved for the portable power supplies. In addition, portable power supplies are being used in additional applications. For example, there is increased interest upon usage of alternative energy sources including electrical energy for an expanding number of applications, such as transportation applications.

Exemplary portable power supplies such as batteries store electrical energy. It may be beneficial to know the state of charge of the batteries during operation of the electrical devices. However, challenges are presented with respect to determining state of charge information with respect to some battery cell chemistries. In one example, it may be difficult to monitor battery cells which have a substantially flat discharge profile.

At least some aspects of the disclosure provide methods and apparatus for monitoring charge of batteries.

BRIEF DESCRIPTION OF THE DRAWINGS

Exemplary embodiments of the disclosure are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

According to one embodiment, a battery charge indication method comprises first determining a state of charge of a battery at a first moment in time using a first method, second determining a state of charge of the battery at a second moment in time using a second method different than the first method, and providing information regarding the state of charge of the battery at the first and second moments in time using information of the first and second determinings.

According to another embodiment, a battery charge indication method comprises monitoring a battery during discharging of the battery in a first discharge cycle, using the monitoring, generating information regarding the discharging of the battery in the first discharge cycle, recharging the battery after the discharging of the battery in the first discharge cycle, providing information regarding a state of charge of the battery during discharging of the battery in a second discharge cycle after the recharging, and wherein the providing the information regarding the state of charge comprises providing using the information regarding the discharging of the battery in the first discharge cycle.

According to yet another embodiment, a battery charge monitoring device comprises an interface configured to couple with a battery and processing circuitry coupled with the interface and configured to provide information regarding a state of charge of the battery at a plurality of different moments in time, wherein the processing circuitry is configured to use a first method to determine the information regarding the state of charge at a first moment in time and to use a second method different than the first method to provide the information regarding the state of charge at a second moment in time.

According to still another embodiment, a rechargeable battery comprises at least one rechargeable cell configured to store electrical energy and to be electrically discharged during a discharged mode of operation and to be electrically charged during a charged mode of operation, and a monitoring device coupled with the at least one rechargeable cell and configured to implement a first method to provide information regarding the state of charge of the rechargeable cell at a first moment in time and to implement a second method to provide information regarding the state of charge of the rechargeable cell at a second moment in time, wherein the first and second methods are different.

According to still another embodiment, an article of manufacture comprises media comprising programming configured to cause processing circuitry to perform processing comprising first monitoring a first electrical parameter of a battery at a first moment in time, first providing information regarding a state of charge of the battery at the first moment in time using the first monitoring, second monitoring a second electrical parameter of the battery at a second moment in time, wherein the first and second electrical parameters are different; and second providing information regarding a state of charge of the battery at the second moment in time using the second monitoring.

Figure 1:
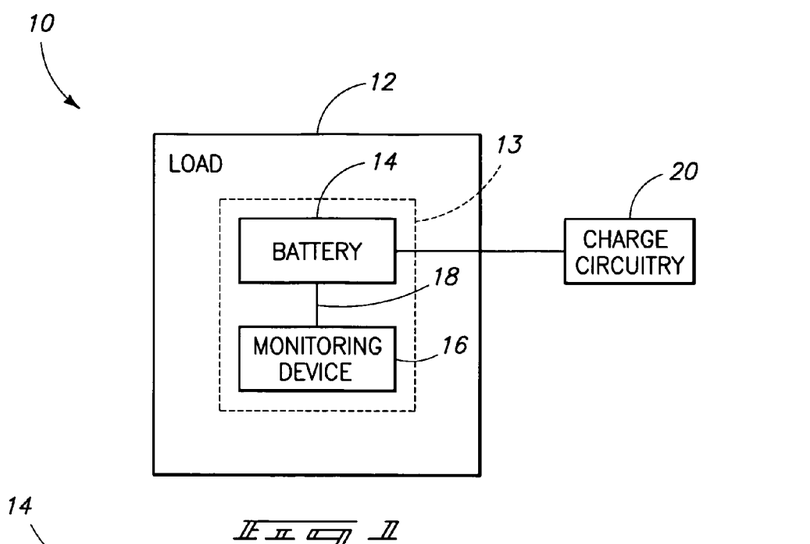
FIG. 1 is a functional block diagram of an electrical system according to one embodiment.

Referring to FIG. 1, an electrical system 10 is depicted according to one embodiment. Electrical system 10 includes a load 12 configured to consume electrical energy and a battery assembly 13 configured to store electrical energy for consumption by load 12. In one embodiment, battery assembly 13 includes a battery 14 and a monitoring device 16. Battery 14 may be rechargeable in one embodiment and charge circuitry 20 may be provided to charge battery 14 when desired or appropriate.

Battery assembly 13 may include a housing (not shown) configured to house battery 14 and monitoring device 16 in one arrangement. Charge circuitry 20 and/or monitoring device 16 may or may not be included within the housing. In addition, battery 14 and/or monitoring device 16 may be external to load 12 in other embodiments.

Monitoring circuitry 16 is configured to perform monitoring operations, such as monitoring a state of charge of battery 14 and/or monitoring the environment (e.g., temperature) in which battery 14 is used. Monitoring device 16 may monitor battery 14 via an interface 18, such as an electrical coupling or bus, in one embodiment.

Figure 2:
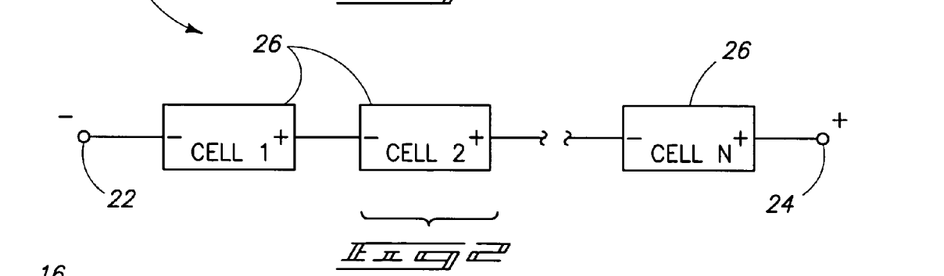
FIG. 2 is a functional block diagram of a battery according to one embodiment.

FIG. 2 illustrates an exemplary configuration of battery 14 according to one embodiment. Battery 14 includes negative and positive terminals 22, 24 and one or more cells 26 coupled in series intermediate terminals 22, 24 in the illustrated configuration. Cells 26 may also be coupled in parallel or in serial/parallel combinations in other possible arrangements. In one embodiment, cells 26 may be individually implemented as a rechargeable cell which has a substantially flat discharge profile and which may be recharged between different discharge cycles. Cells 26 may be embodied as Lithium-Ion 3.2 Volt cells embodying Saphion(R) technology in a battery having product number 18695-00001 available from Valence Technology, Inc. in but one possible implementation.

For example, cells 26 may individually comprise an electrode active material in one embodiment represented by the general formula $A_aMPO_4$, where A is Li, and $0<a\leq 1$; and $M=MI_{n-p}MII_o$, wherein o=p, $0<o\leq 0.5$, MI is iron (Fe), and MII is selected from the group consisting of $Be^{2+}$, $Mg^{2+}$, $Ca^{2+}$, $Sr^{2+}$, $Ba^{2+}$, and mixtures thereof.

In a more specific embodiment, the electrode active material may be represented by the general formula $A_aM_m(PO_4)_3$, where A is Li, and $0<a\leq 5$, and M is selected from the group consisting of $Ti^{3+}$, $V^{3+}$, $Cr^{3+}$, $Mn^{3+}$, $Fe^{3+}$, $Co^{3+}$, $Ni^{3+}$, $Mo^{3+}$, $Nb^{3+}$, and mixtures thereof, and $1<m\leq 3$; and where A, M, a and m are selected so as to maintain electroneutrality of the electrode active material. Additional details regarding exemplary cells 26 are disclosed in U.S. Pat. No. 6,136,472 to Barker et al, U.S. Pat. No. 4,477,541 to Fraioli, International Publication No. WO01/54212; International Publication No. WO98/12761; International Publication No. WO00/01024; International Publication No. WO00/31812; International Publication No. WO00/57505; International Publication No. WO02/44084; International Publication No. WO03/085757; International Publication No. WO03/085771; International Publication No. WO03/088383; U.S. Pat. No. 6,528,033 to Barker et al; U.S. Pat. No. 6,387,568 to Barker et al.; U.S. Publication No. 2003/0027049 listing Jeremy Barker et al as inventors; U.S. Publication No. 2002/0192553 listing Jeremy Barker et al as inventors; U.S. Publication No. 2003/0170542 listing Jeremy Barker et al as inventors; U.S. Publication No. 2003/0129492 listing Jeremy Barker as inventor; U.S. Pat. No. 5,700,298 to Shi et al.; U.S. Pat. No. 5,830,602 to Barker et al.; U.S. Pat. No. 5,418,091 to Gozdz et al.; U.S. Pat. No. 5,508,130 to Golovin; U.S. Pat. No. 5,541,020 to Golovin et al.; U.S. Pat. No. 5,620,810 to Golovin et al.; U.S. Pat. No. 5,643,695 to Barker et al.; U.S. Pat. No. 5,712,059, to Barker et al.; U.S. Pat. No. 5,851,504 to Barker et al.; U.S. Pat. No. 6,020,087 to Gao; U.S. Pat. No. 6,103,419 to Saidi et al.; U.S. Pat. No. 4,668,595 to Yoshino et al.; U.S. Pat. No. 4,792,504 to Schwab et al.; U.S. Pat. No. 4,830,939 to Lee et al.; U.S. Pat. No. 4,935,317 to Fauteaux et al.; U.S. Pat. No. 4,990,413, to Lee et al.; U.S. Pat. No. 5,037,712 to Shackle et al.; U.S. Pat. No. 5,262,253 to Golovin; U.S. Pat. No. 5,300,373 to Shackle; U.S. Pat. No. 5,399,447 to Chaloner-Gill; U.S. Pat. No. 5,411,820 to Chaloner-Gill; U.S. Pat. No. 5,435,054 to Tonder et al.; U.S. Pat. No. 5,463,179 to Chaloner-Gill et al.; U.S. Pat. No. 5,482,795 to Chaloner-Gill.; U.S. Pat. No. 5,660,948 to Barker; U.S. Pat. No. 5,869,208, to Miyasaka; U.S. Pat. No. 5,882,821 to Miyasaka; U.S. Pat. No. 5,616,436 to Sonobe. et al.; and U.S. Pat. No. 6,306,215 to Larkin, the teachings of all of which are incorporated herein by reference. Other configurations of cells 26 are possible.

Figure 3:
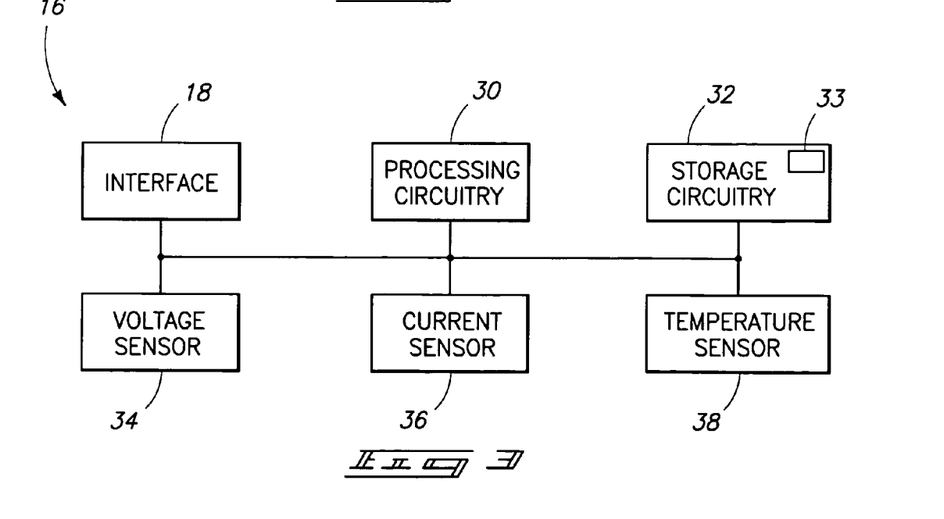
FIG. 3 is a functional block diagram of a monitoring device according to one embodiment.

Referring to FIG. 3, an exemplary arrangement of monitoring device 16 is shown according to one embodiment. Monitoring device 16 can include monitoring circuitry configured to perform monitoring operations, for example, with respect to battery 14 and/or an environment in which battery assembly 13 resides for use in one embodiment. In the depicted configuration, monitoring device 16 includes an interface 18, processing circuitry 30, storage circuitry 32, a voltage sensor 34, a current sensor 36, and a temperature sensor 38. Other embodiments of monitoring device 16 are possible including more, less and/or alternative components. For example, a user interface, such as a visual display, may be included in some embodiments to convey information regarding electrical system 10 to a user. In one example, processing circuitry 30 may control a user interface to convey state of charge information regarding battery 14 at different moments in time and at different states of charge.

In one embodiment, processing circuitry 30 is arranged to process data, control data access and storage, issue commands, and control other desired operations. Processing circuitry 30 may comprise circuitry configured to implement desired programming provided by appropriate media in at least one embodiment. For example, the processing circuitry 30 may be implemented as one or more of a processor and/or other structure configured to execute executable instructions including, for example, software and/or firmware instructions, and/or hardware circuitry. Exemplary embodiments of processing circuitry 30 include hardware logic, PGA, FPGA, ASIC, state machines, and/or other structures alone or in combination with a processor. These examples of processing circuitry 30 are for illustration and other configurations are possible.

Storage circuitry 32 is configured to store programming such as executable code or instructions (e.g., software and/or firmware), electronic data, databases, or other digital information and may include processor-usable media 33. Processor-usable media 33 may be embodied in any computer program product(s) or article of manufacture(s) which can contain, store, or maintain programming, data and/or digital information for use by or in connection with an instruction execution system including processing circuitry in the exemplary embodiment. For example, exemplary processor-usable media 33 may include any one of physical media such as electronic, magnetic, optical, electromagnetic, infrared or semiconductor media. Some more specific examples of processor-usable media include, but are not limited to, a portable magnetic computer diskette, such as a floppy diskette, zip disk, hard drive, random access memory, read only memory, flash memory, cache memory, and/or other configurations capable of storing programming, data, or other digital information.

At least some embodiments or aspects described herein may be implemented using programming stored within appropriate storage circuitry 32 described above and/or communicated via a network or other transmission media and configured to control appropriate processing circuitry 30. For example, programming may be provided via appropriate media including, for example, embodied within articles of manufacture, embodied within a data signal (e.g., modulated carrier wave, data packets, digital representations, etc.) communicated via an appropriate transmission medium, such as a communication network (e.g., the Internet and/or a private network), wired electrical connection, optical connection and/or electromagnetic energy, for example, via a communications interface, or provided using other appropriate communication structure or medium. Exemplary programming including processor-usable code may be communicated as a data signal embodied in a carrier wave in but one example.

Voltage sensor 34 is configured to monitor one or more voltage of battery 14 in the described implementation. For example, voltage sensor 34 may be configured to monitor voltages of individual cells 26 as well as the entire voltage of battery 14 in one embodiment. It may be desired to measure the voltage of cell 1 (i.e., the cell coupled with ground) in some embodiments employing a plurality-of cells 26 to obtain the most accurate voltage measurement of an individual cell of battery 14 if level shifting circuitry is employed between the remaining cells and analog-to-digital (A/D) sampling circuitry (not shown). The voltage of cell 1 is referred to as $V_{cell1}$ below and the remaining cells 26 of battery 14 other than cell 1 may be referred to as upper cells.

Current sensor 36 is configured to measure current into and/or out of battery 14 during charging and/or discharging of battery 14 in one embodiment. Current sensor 26 may be configured to monitor the current at the negative terminal 22 of battery 14 in one embodiment.

As mentioned above, monitoring device 16 may additionally monitor conditions regarding the environment in which battery 14 resides at different moments in time. In the depicted embodiment, temperature sensor 38 is configured to provide information regarding the ambient temperature of the environment about battery assembly 13. Other environmental conditions may be monitored in other embodiments.

Monitoring device 16 may be additionally configured to monitor state of charge of battery 14 and may be referred to as state of charge monitoring circuitry in one arrangement. Monitoring device 16 may convey state of charge information, for example by a user interface located at load 12 and/or battery assembly 13 in exemplary embodiments, at different moments in time of charging and/or discharging of battery 14. As described in further detail below, processing circuitry 30 may be configured to perform a plurality of methods described herein at different moments in time using information of one or more sensors 34, 36, 38 and/or discharge voltage profiles of cells 26 to provide state of charge information according to one embodiment.

Processing circuitry 30 may utilize a first method, which may be referred to as Model 1, at appropriate moments in time to provide state of charge information of battery 14. Model 1 uses Coulomb counting which may be modified using temperature profile information of cells 26 in one embodiment. More specifically, the state of charge (SOC) of Model 1 is determined in one configuration as:

$$Model1SOC = \frac{LearnedCapacity - CountedCapacity}{LearnedCapacity} \quad \text{Eqn. 1}$$

Counted capacity of Eqn. 1 may be accumulated by integrating battery current as provided by current sensor 36 with respect to time. The Model 1 SOC may be calculated by comparing the value of counted capacity to a learned capacity (which may be modified by temperature of the environment as discussed further below). Usage of the learned capacity accommodates for decreasing capacity of the aging of cells 26. Upon initial manufacture of cells 26, the learned capacity may be set to a default value, such as corresponding to a nominal capacity of fully charged cells. Thereafter, learned capacity may be calculated at different moments in time and corresponding to use of the battery 14. In one embodiment, the learned capacity may be recalculated at moments in time when the state of charge of battery 14 drops below 20%. A recalculated value may be used in Eqn. 1 until the battery 14 is fully charged and the state of charge again drops below 20% in one embodiment.

During recalculation, the learned capacity may be adjusted based on the counted capacity with respect to present temperature and the reported state of charge which may be equal to the last state of charge determined by processing circuitry 30. In one embodiment, learned capacity may be determined by:

$$LearnedCapacity = \frac{CountedCapacity(T)}{100\% - reportedSOC} \quad \text{Eqn. 2}$$

where T may be used to adjust the counted capacity by the temperature of the environment. For example, if a cell 26 is at −20° C. and it is known (e.g., from an empirical temperature profile of the cell) that the cell 26 will only deliver 50% of its capacity for a typical discharge rate at the temperature, then the counted capacity may be divided by the percentage of the capacity (e.g., 50%). Usage of Eqn. 2 provides a ratio of the amount of capacity used versus the amount of capacity believed to be remaining at a given moment in time. In addition, the learned capacity may be determined during one discharge cycle of battery 14 and the determined learned capacity may be used in Eqn. 1 to determine state of charge of battery 14 during a different, subsequent discharge cycle of the battery 14.

Referring again to Eqn. 1, the value of learned capacity may be further adjusted according to the temperature profile of the type and chemistry of cells 26 being utilized. For example, if the cell 26 is at −20° C. and it is known that it will only deliver 50% of its capacity for a typical discharge rate at the given temperature, then the learned capacity value may be multiplied by 50%. In the exemplary configuration using cells 26 which embody Saphion(R) technology, the cells 26 are not able to deliver their entire charge when at low temperatures. In this situation, the Model 1 SOC increases as battery 14 is exposed to increasing temperatures.

During periods of storage or non-use of battery 14, self-discharge may be approximated. For example, if monitoring device 16 continues to draw current during periods of non-use, the length of time of non-use may be monitored and used in conjunction with a determined value indicative of the load of monitoring device 16 to estimate self-discharge. The determined self-discharge for a given period of non-use may be used to adjust the counted capacity value of Eqn. 1. The counted capacity may be reset to zero when a full charge is completed (e.g., detected by monitoring charge current and voltage of cells 26) in one embodiment.

As mentioned above, processing circuitry 30 may utilize a plurality of methods to monitor state of charge of battery 14 at different moments in time. Processing circuitry 30 may use one or more discharge voltage profile to monitor state of charge according to at least one additional method. The profiles may be empirically determined using the specific cells 26 employed within battery 14. The profiles may include SOC slope and offset values over a plurality of voltage segments (e.g., eight) corresponding to voltages of cells 26. The SOC slope and offset values may be stored for a plurality of discharge current rates (e.g., five) over a plurality of temperatures (e.g., six different temperatures within a range of −20 to 70 degrees). Profiles of increased or lesser accuracy may be used in other embodiments.

According to the presently described method, the initial state of charge of cells 26 may be calculated using two discharge voltage profiles adjacent to an observed discharge current. The initial state of charge may be calculated using a weighted average (e.g., linear interpolation) of the two temperature curves adjacent to the observed temperature of the environment of use. The Model 2 SOC may thereafter be determined by combining the discharge voltage profiles using a weighted average (e.g., linear interpolation) to the observed discharge current.

In one example, if a five Amp-hour battery is being discharged at a current of 3.2 Amps, and temperature is 33° C. and five stored discharge voltage profiles at 0.625, 1, 2.5, 5 and 10 Amps, each containing profiles for six temperature ranges at −20, −10, 0, 10, 22 and 45° C., then four results are initially calculated including the SOC at 2.5 Amps and 22° C., the SOC at 2.5 Amps and 45° C., the SOC at 5 Amps and 22° C., and the SOC at 5 Amps and 45° C. The two SOC calculations at 2.5 Amps may be averaged using a weighting between 22° C. and 45° C. for the observed temperature of 33° C. The process may be repeated for the calculations at 5 Amps. The two SOC results at 2.5 Amps and 5 Amps may be averaged using a weighting between 2.5 Amps and 5 Amps for the observed current of 3.2 Amps in the described example to provide the Model 2 SOC. For a given discharge current and temperature for the above-described cells 26, the relationship between voltage and state of charge is stable over the cycle life of cells 26. In one embodiment, the voltage used in Model 2 is equal to the voltage of the cell having the lowest voltage.

Accordingly, in the exemplary embodiment employing Models 1 and 2 described above, processing circuitry 30 may be configured to monitor different electrical parameters of battery 14 to provide the state of charge information. For example, as discussed above, processing circuitry 14 may be configured to monitor discharge current of battery 14 (e.g., with respect to Coulomb counting) during Model 1 and to monitor voltage of at least one cell 26 of battery during Model 2 in the described examples.

The above-described exemplary Models 1 and 2 may be used in a plurality of methods by processing circuitry 30 to determine the state of charge of battery 14 at different moments in time. In addition, the Models 1 and 2 may be used separately or in combination with one another to determine state of charge of battery 14 at different moments in time in exemplary embodiments. In the exemplary embodiment described below, four methods (referred to as SOC Modes 1-4) are used to determine the state of charge of battery 14 at moments in time determined by corresponding rules set forth below the following discussion of the modes.

In one or more of the following modes, a slew rate control may be provided where the reported state of charge (i.e., the state of charge indication provided by processing circuitry 30 for example to the user interface indicating the state of charge of battery 14) is not permitted to change two times faster than the fastest discharge to which the battery 14 is capable. Other methods may be used in other embodiments.

For a first of the modes, the reported state of charge (SOC Mode 1) is equal to the state of charge provided by Model 1.

For a second mode, the reported state of charge (SOC Mode 2) is calculated based on a weighting of both Models 1 and 2 and relies minimally on Model 1 leading up to the end of discharge (e.g., this method relies more upon Model 2 and less on Model 1 over the last quarter of discharge). One example equation for determining the state of charge in the second mode is:

$$\text{Reported } SOC = 2 \times SOC \times \text{Model1} SOC + (100\% - 2 \times SOC) \times \text{Model2} SOC \qquad \text{Eqn. 3}$$

where SOC as used in Eqn. 3 is the last reported state of charge. The last reported state of charge value may be stored in storage circuitry 32 in one embodiment. The value may be stored upon shut down and recalled at boot-up and the reported state of charge may be initialized to the stored value in one embodiment. If battery 14 is provided in storage, Model 1 immediately reflects the initialized value, and the reported state of charge may be corrected within a few iterations after boot-up. The state of charge of Mode 2 may be averaged over a desired time period, such as thirty seconds, in one embodiment.

For a third mode, the reported state of charge (SOC Mode 3) may be calculated based on a weighting of Model 1 by the following exemplary equation:

$$\text{Reported } SOC = 2 \times \text{Model1} \times (100\% \times SOC) \qquad \text{Eqn. 4}$$

where SOC as used in Eqn. 4 is the last reported state of charge. Eqn. 4 is derived from replacing Model 2 in Eqn. 3 with two times Model 1.

For a fourth mode, the reported state of charge (SOC Mode 4) is equal to the state of charge provided by Model 2. The reported state of charge may correspond to the values provided by Model 2 averaged over a desired time period, such as thirty seconds, in one embodiment.

In one embodiment, mode control rules may be defined to control the methods used by processing circuitry 30 to monitor and/or provide information regarding state of charge of battery 14. Processing circuitry 30 may be programmed to implement the rules in one embodiment. The described rules are exemplary for the described embodiment and more, less and/or alternative rules may be provided in other embodiments.

Processing circuitry 30 may operate in SOC Mode 1 when battery 14 is fully charged. During operations in SOC Mode 1, the processing circuitry 30 switches to SOC Mode 2 if the state of charge falls below a threshold (e.g., 50% or lower). In one implementation, when entering SOC Mode 2 from SOC Mode 1, the voltage used in Model 2 is $V_{cell1}$ of cell 1 discussed above.

Voltage values of individual ones of the cells 26 may be recorded on start-up of electrical system 10. In SOC Mode 2, if any of the voltage values of the upper cells increases more than 40 mV, then SOC Mode 2 uses the voltage of the cell having the lowest voltage in Model 2. This rule accommodates an out of balance situation in SOC Mode 2.

In SOC Mode 2, if the state of charge of Model 2 is greater than the state of charge than Model 1 times two, then the processing circuitry 30 switches to SOC Mode 3. This rule accommodates an occurrence that after a partial charge the state of charge of Model 2 is not accurate until battery 14 is loaded and also address an overly conservative learned capacity.

In SOC Mode 3, if Model 2 is less than or equal to Model 1 times two then processing circuitry 30 switches to SOC Mode 2.

In any of the SOC Modes 1-3, if the state of charge of any cell 26 is detected at or below 10% without averaging then the algorithm switches to SOC Mode 4.

In any of the SOC Modes 1-3, if the state of charge of Model 1 is greater than the state of charge of Model 2, and the difference is greater than 50% of the reported state of charge, the processing circuitry 30 may switch to SOC Mode 4. This rule accommodates an overly optimistic learned capacity.

With the following exceptions, the processing circuitry 30 remains in a selected SOC Mode through periods of non-use of battery 14. In SOC Mode 2, the processing circuitry 30 switches to SOC Mode 1 if battery 14 receives charge providing the state of charge of Model 1 above 50%. In SOC Mode 4, the processing circuitry 30 switches to SOC Mode 2 if battery 14 receives any charge less than a full charge or battery 14 is not charged or discharged for a period of time (e.g., 10 seconds). During SOC Mode 2, the processing circuitry 30 may use a voltage of the cell 26 having the lowest voltage in Model 2. Processing circuitry 30 moves to SOC Mode 1 following a full charge of battery 14 and completion of a balancing procedure to balance the cells 26.

The state of charge may be latched and stored by storage circuitry 32 if it reaches 0% in one configuration. The state of charge of battery 14 is reported as 0% until charge current is detected in one embodiment.

In one embodiment, the state of charge of Model 1 does not go lower than 10% unless processing circuitry 30 is operating in SOC Mode 2 to prevent an overly conservative learned capacity from being corrected.

During typical operations, the reported state of charge is provided by SOC Mode 1 with a balanced battery 14 in normal operation. After SOC Mode 1, the processing circuitry 30 may move to SOC Mode 2 when the state of charge is <=50% and then SOC Mode 4 when the state of charge of any cell 26 is detected at or below 10%.

Discharging of batteries may involve different patterns in different applications. In an exemplary transportation application, different patterns may correspond to regularity of use, terrain, style, charge opportunity and temperature. In one embodiment, monitoring and providing information regarding state of charge may utilize information regarding capacity observed over a user's previous discharge pattern or cycle. Accordingly, the Model 1 SOC discussed above may have increased accuracy if a user operates a load 12 and charger 20 in a similar manner from full charge to a knee of the discharge voltage profile (e.g., the point in the profile where the relatively flat profile starts to change at a more significant rate) as a previous use.

As described above, some aspects of the disclosure provide state of charge information of a battery. At least one of the above-described aspects may be used with batteries having substantially flat discharge voltage profiles with increased accuracy over pure Coulomb counting strategies or strategies using learning functions which occur periodically over a life of the battery after a complete charge followed by a complete discharge. For example, pure Coulomb counting may be periodically adjusted (e.g., at full charge or complete discharge) to correct for inaccuracies. In addition, strategies which use learning functions typically can not provide accurate state of charge information leading up to or during the learning cycle (e.g., the state of charge indication may be overly conservative leaving usable energy within the battery when a charge is indicated to be needed, may be overly optimistic leaving the customer without warning of a dead battery and/or may fluctuate with temperature). Also, impedance monitoring solutions may not be applicable to cells whose impedance is substantially constant until the very end of discharge (e.g., lithium-phosphate cells).

According to one embodiment described above, a learning function based upon previous usage of the battery is implemented to increase accuracy of state of charge information during subsequent uses. The learning function is automatic without user input in at least one configuration. Furthermore, one embodiment of the disclosure accommodates temperature and reduces affects of temperature upon state of charge indications. Some embodiments provide state of charge information in multiple cell battery arrangements and in states where the cells may be out of balance with one another. As further disclosed above according to one implementation, a linear state of charge calculation reaching 0% is provided when the available energy of the battery has been used. In addition, accuracies of less than 1% error are believed provided between 10% state of charge and fully discharged, and less than 5% error between 100% and 10% state of charges in some configurations. Additionally, at least one embodiment accounts for self-discharge during periods of non-use of the battery.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

Further, aspects herein have been presented for guidance in construction and/or operation of illustrative embodiments of the disclosure. Applicant(s) hereof consider these described illustrative embodiments to also include, disclose and describe further inventive aspects in addition to those explicitly disclosed. For example, the additional inventive aspects may include less, more and/or alternative features than those described in the illustrative embodiments. In more specific examples, Applicants consider the disclosure to include, disclose and describe methods which include less, more and/or alternative steps than those methods explicitly disclosed as well as apparatus which includes less, more and/or alternative structure than the explicitly disclosed structure.

What is claimed is:

1. A battery charge indication method comprising:
   first determining a state of charge of a battery at a first moment in time using a first method;
   second determining a state of charge of the battery at a second moment in time using a second method different than the first method;
   providing information regarding the state of charge of the battery at the first and second moments in time using information of the first and second determining; and
   switching between the first method and the second method using the state of charge of the battery.

2. The method of claim 1 further comprising third determining information regarding the state of charge of the battery at a third moment in time by combining information of the first and second methods at the third moment in time.

3. The method of claim 1 wherein first and second determinings comprise monitoring different electrical parameters of the battery during respective ones of the first and second determinings.

4. The method of claim 1 wherein the first determining comprises counting Coulombs of a current of the battery and the second determining comprises monitoring voltage of a cell of the battery.

5. The method of claim 4 further comprising third determining information regarding the state of charge of the battery at a third moment in time by combining information of the first and second methods at the third moment in time.

6. The method of claim 1 further comprising recharging the battery from a first state of charge to a second state of charge greater than the first state of charge, and indicating the state of charge of the battery before and after the recharging.

7. The method of claim 1 wherein at least one of the first and the second determinings comprises accommodating for decreased capacity of the battery.

8. The method of claim 1 wherein at least one of the first and the second determinings comprises determining using a discharge voltage profile of a cell of the battery.

9. The method of claim 1 further comprising monitoring temperature, and wherein at least one of the first and the second determinings comprises determining using the temperature.

10. The method of claim 1 further comprising indicating the information regarding the state of charge of the battery to a user.

11. The method of claim 1 wherein the first and second moments in time occur during respective first and second discharge cycles of the battery comprising a rechargeable battery, and wherein the second determining comprises determining using information obtained during the first discharge cycle.

12. A battery charge indication method comprising:
monitoring a battery during discharging of the battery in a first discharge cycle;
using the monitoring, generating information regarding the discharging of the battery in the first discharge cycle;
recharging the battery after the discharging of the battery in the first discharge cycle;
providing information regarding a state of charge of the battery during discharging of the battery in a second discharge cycle after the recharging; and
wherein the providing the information regarding the state of charge comprises providing using the information regarding the discharging of the battery in the first discharge cycle.

13. The method of claim 12 further comprising providing information regarding the state of charge of the battery during discharging of the battery in the first discharge cycle, and wherein the providings of the information during the discharging of the battery in the first and second discharge cycles comprises providing using respective ones of a plurality of different methods for calculating the state of charge.

14. The method of claim 12 further comprising monitoring the battery during discharging of the battery in the second discharge cycle, and wherein the providing the information regarding the state of charge of the battery comprises providing using information of the monitoring the battery during discharging of the battery in the second discharge cycle.

15. The method of claim 12 wherein the monitoring of the battery comprises monitoring a plurality of different electrical parameters of the battery at different moments in time.

16. A battery charge monitoring device comprising:
an interface configured to couple with a battery;
processing circuitry coupled with the interface and configured to provide information regarding a state of charge of the battery at a plurality of different moments in time, wherein the processing circuitry is configured to use a first method to determine the information regarding the state of charge at a first moment in time and to use a second method different than the first method to provide the information regarding the state of charge at a second moment in time; and
wherein the processing circuitry is configured to use a third method to provide information regarding the state of charge of the battery at a third moment in time, wherein the third method is different than the first and second methods and uses information obtained using the first and the second methods at the third moment in time.

17. The device of claim 16 wherein the processing circuitry is configured to monitor respective ones of a plurality of different electrical parameters of the battery during the usage of the first method and the second method.

18. The device of claim 16 wherein the processing circuitry is configured to monitor a current of the battery during the use of the first method and to monitor a voltage of a cell of the battery during the use of the second method.

19. The device of claim 18 wherein the processing circuitry is configured to compare the voltage of the cell with a discharge voltage profile of the cell to determine information regarding the state of charge at the second moment in time.

20. The device of claim 16 wherein the processing circuitry is configured to switch from use of the first method to use of the second method responsive to the state of charge of the battery.

21. The device of claim 16 wherein the processing circuitry is configured to switch from use of the first method to use of the second method responsive to the state of charge of the battery reaching a threshold.

22. The device of claim 16 wherein the processing circuitry is configured to monitor temperature and to adjust information regarding the state of charge according to the temperature.

23. A rechargeable battery comprising:
at least one rechargeable cell configured to store electrical energy and to be electrically discharged during a discharged mode of operation and to be electrically charged during a charged mode of operation;
a monitoring device coupled with the at least one rechargeable cell and configured to implement a first method to provide information regarding the state of charge of the rechargeable cell at a first moment in time and to implement a second method to provide information regarding the state of charge of the rechargeable cell at a second moment in time, wherein the first and second methods are different; and
wherein the monitoring device is configured to accommodate for decreased capacity of the rechargeable cell during implementation of at least one of the first and second methods to provide the information regarding the state of charge.

24. The battery of claim 23 wherein the monitoring device is configured to implement a third method to provide information regarding the state of charge of the rechargeable cell at a third moment in time, wherein the third method is different than the first and second methods and uses information provided by the first and the second methods at the third moment in time.

25. The battery of claim 23 wherein the monitoring device is configured to monitor different electrical parameters of the rechargeable cell during respective implementations of the first method and the second method.

26. The battery of claim 23 wherein the monitoring device is configured to change from implementing the first method to the second method using the state of charge of the rechargeable cell.

27. A battery charge indication method comprising:
first determining a state of charge of a battery at a first moment in time using a first method;
second determining a state of charge of the battery at a second moment in time using a second method different than the first method;
providing information regarding the state of charge of the battery at the first and second moments in time using information of the first and second determining; and wherein the first and second moments in time occur during respective first and second discharge cycles of the battery comprising a rechargeable battery, and wherein the second determining comprises determining using information obtained during the first discharge cycle.

28. A battery charge monitoring device comprising:
an interface configured to couple with a battery;
processing circuitry coupled with the interface and configured to provide information regarding a state of charge of the battery at a plurality of different moments in time, wherein the processing circuitry is configured to use a first method to determine the information regarding the state of charge at a first moment in time and to use a second method different than the first method to provide the information regarding the state of charge at a second moment in time; and
wherein the processing circuitry is configured to monitor a current of the battery during the use of the first method and to monitor a voltage of a cell of the battery during the use of the second method.

29. A battery charge monitoring device comprising:
an interface configured to couple with a battery;
processing circuitry coupled with the interface and configured to provide information regarding a state of charge of the battery at a plurality of different moments in time, wherein the processing circuitry is configured to use a first method to determine the information regarding the state of charge at a first moment in time and to use a second method different than the first method to provide the information regarding the state of charge at a second moment in time; and
wherein the processing circuitry is configured to use a discharge voltage profile of a cell of the battery to determine information regarding the state of charge at the second moment in time.

30. The device of claim 29 wherein the processing circuitry is configured to compare a voltage of the cell with the discharge voltage profile of the cell to determine the information regarding the state of charge at the second moment in time.

31. A battery charge monitoring device comprising:
an interface configured to couple with a battery;
processing circuitry coupled with the interface and configured to provide information regarding a state of charge of the battery at a plurality of different moments in time, wherein the processing circuitry is configured to use a first method to determine the information regarding the state of charge at a first moment in time and to use a second method different than the first method to provide the information regarding the state of charge at a second moment in time; and
wherein the processing circuitry is configured to switch from use of the first method to use of the second method using the state of charge of the battery.

32. The device of claim 31 wherein the processing circuitry is configured to switch from use of the first method to use of the second method responsive to the state of charge of the battery reaching a threshold.

33. A battery charge monitoring device comprising:
an interface configured to couple with a battery;
processing circuitry coupled with the interface and configured to provide information regarding a state of charge of the battery at a plurality of different moments in time, wherein the processing circuitry is configured to use a first method to determine the information regarding the state of charge at a first moment in time and to use a second method different than the first method to provide the information regarding the state of charge at a second moment in time; and
wherein the processing circuitry is configured to monitor an environment about the battery and to adjust information regarding the state of charge using the monitoring.

34. The method of claim 1 wherein one of the first and second determinings comprises determining the state of charge of the battery using information regarding an electrical parameter of the battery and wherein an other of the first and second determinings comprises determining the state of charge of the battery not using information regarding the electrical parameter.

35. The device of claim 31 wherein the processing circuitry is configured to use information regarding an electrical parameter of the battery during use of one of the first and second methods and the processing circuitry is configured to not use information regarding the electrical parameter of the battery during use of an other of the first and second methods.

36. The device of claim 33 wherein the processing is configured to monitor temperature of the environment to monitor the environment about the battery and to adjust the information regarding the state of charge using the temperature of the environment.

37. The method of claim 1 wherein the switching comprises switching between use of the first method and use of the second method to determine the state of charge of the battery.

* * * * *

UNITED STATES PATENT AND TRADEMARK OFFICE
CERTIFICATE OF CORRECTION

PATENT NO. : 7,723,958 B2
APPLICATION NO. : 11/394726
DATED : May 25, 2010
INVENTOR(S) : Christopher Darilek It is certified that error appears in the above-identified patent and that said Letters Patent is hereby corrected as shown below:

Col. 8, line 18, replace "*Reported SOC = 2 X Model1 X (100% x SOC)*" before "Eqn. 4" with -- *Reported SOC = 2 X Model1 X (100% - SOC)* --.

Signed and Sealed this

Seventh Day of September, 2010

David J. Kappos
*Director of the United States Patent and Trademark Office*